United States Patent
Chen

(10) Patent No.: US 10,627,689 B2
(45) Date of Patent: Apr. 21, 2020

(54) CURVED DISPLAY SCREEN AND MANUFACTURING METHOD THEREOF

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 56 days.

(21) Appl. No.: 15/846,703

(22) Filed: Dec. 19, 2017

(65) Prior Publication Data

US 2018/0267379 A1 Sep. 20, 2018

Related U.S. Application Data

(63) Continuation of application No. PCT/CN2017/116146, filed on Dec. 14, 2017.

(30) Foreign Application Priority Data

Mar. 14, 2017 (CN) .......................... 2017 1 0151426

(51) Int. Cl.
*G02F 1/1368* (2006.01)
*G02F 1/1343* (2006.01)
*H01L 27/12* (2006.01)
*G02F 1/1362* (2006.01)
*G02F 1/1333* (2006.01)
*G02F 1/1335* (2006.01)

(52) U.S. Cl.
CPC ...... *G02F 1/136286* (2013.01); *G02F 1/1368* (2013.01); *G02F 1/13439* (2013.01); *G02F 1/133371* (2013.01); *H01L 27/124* (2013.01); *H01L 27/1218* (2013.01); *H01L 27/1262* (2013.01); *G02F 1/133514* (2013.01); *G02F 2001/133302* (2013.01); *G02F 2001/136295* (2013.01); *G02F 2201/121* (2013.01)

(58) Field of Classification Search
None
See application file for complete search history.

(56) References Cited

U.S. PATENT DOCUMENTS 10,121,452 B2 * 11/2018 Shin .................... H01L 27/1255

* cited by examiner

*Primary Examiner* — Robert K Carpenter
(74) *Attorney, Agent, or Firm* — WPAT, PC

(57) ABSTRACT

A curved display screen and a manufacturing method thereof are provided. The curved display screen includes a first substrate and a second substrate. The first substrate includes an active switch array, and the active switch array includes several wires. The second substrate includes a transparent electrode layer. Any two regions respectively are defined as a first region and a second region, if a spacing between the first substrate and the second substrate in the first region is greater than a spacing between the first substrate and the second substrate in the second region, and an area of the wire on the first substrate in the first region is larger than an area of the wire in the second region.

8 Claims, 1 Drawing Sheet

CURVED DISPLAY SCREEN AND MANUFACTURING METHOD THEREOF

FIELD OF THE DISCLOSURE

The disclosure relates to the field of display technology, and more particularly to a curved display screen and a manufacturing method thereof.

BACKGROUND

The liquid crystal display (LCD) is one of the most widely used displays on the market, especially widely used in liquid crystal televisions (TVs). For the liquid crystal televisions, consumers in addition to the pursuit of clarity, have higher requirements in appearance of performance such as lightweight and slim, narrow border, curved and so on. In recent years, the popular curved liquid crystal televisions, because of their appearances more beautiful, realistic scene when watching, more comfortable visual experience and other characteristics, have been favored by more and more consumers.

The curved liquid crystal television usually uses inherent flexibility of glasses to achieve a bending effect, but this design will also bring some drawbacks for example, the panel after being bent will exhibit inconsistent cell gaps (i.e., liquid crystal cell thickness) in left, middle and right regions, that is, a spacing between a TFT (thin film transistor) substrate and a CF (color filter) substrate is uneven, so that the phenomenon of dark edges may appear in the display effect.

SUMMARY

Accordingly, it is necessary to provide a curved display screen and a manufacturing method thereof, so as to solve the problem of display effect being affected by inconsistent spacings between two substrates of the curved display screen in left, middle and right regions.

In one aspect, a curved display screen according to an embodiment of the disclosure includes: a first substrate, wherein the first substrate includes an active switch array, and the active switch array includes several wires; and a second substrate, wherein the second substrate includes a transparent electrode layer. Two regions of the curved display screen respectively are defined as a first region and a second region, a spacing between the first substrate and the second substrate in the first region is greater than a spacing between the first substrate and the second substrate in the second region, and on the first substrate, an area of the wire in the first region is larger than an area of the wire in the second region. The wires include source-column wires and gate scan wires.

In one embodiment, if the spacing between the first substrate and the second substrate in the first region is greater than the spacing between the first substrate and the second substrate in the second region, a width of the source-column wire on the first substrate in the first region is greater than a width of the source-column wire on the first substrate in the second region.

In one embodiment, a width of the widest one of the source-column wires is between 7 μm and 10 μm.

In one embodiment, the transparent electrode layer is a common electrode.

In another aspect, a curved display screen provided by the disclosure includes: a first substrate, wherein the first substrate includes an active switch array, and the active switch array comprises several wires; and a second substrate, wherein the second substrate includes a transparent electrode layer. Two regions of the curved display screen respectively are defined as a first region and a second region, a spacing between the first substrate and the second substrate in the first region is greater than a spacing between the first substrate and the second substrate in the second region, and on the first substrate, an area of the wire in the first region is larger than an area of the wire in the second region.

In one embodiment, the wires include source-column wires.

In one embodiment, if the spacing between the first substrate and the second substrate in the first region is greater than the spacing between the first substrate and the second substrate in the second region, a width of the source-column wire on the first substrate in the first region is greater than a width of the source-column wire on the first substrate in the second region.

In one embodiment, a width of the widest one of the source-column wires is between 7 μm and 10 μm.

In one embodiment, the wires include gate scan wires.

In one embodiment, the transparent electrode layer is a common electrode.

In one embodiment, the wires include source-column wires, and the transparent electrode layer is a common electrode.

In one embodiment, the wires include gate scan wires, and the transparent electrode layer is a common electrode.

In still another aspect, a manufacturing method of a curved display screen is provided. The curved display screen includes a first substrate and a second substrate, the first substrate includes an active switch array, the active switch array comprises several wires, and the second substrate includes a transparent electrode layer. The manufacturing method includes: a process of preparing the first substrate, including a step of forming the plurality of wires; and defining two regions respectively as a first region and a second region, and if a spacing between the first substrate and the second substrate in the first region is greater than a spacing between the first substrate and the second substrate in the second region, in the step of forming the plurality of wires, an area of the wire on the first substrate in the first region is set to be larger than an area of the wire on the first substrate in the second region.

In one embodiment, the wires include source-column wires.

In one embodiment, if the spacing between the first substrate and the second substrate in the first region is greater than the spacing between the first substrate and the second substrate in the second region, a width of the source-column wire on the first substrate in the first region is greater than a width of the source-column wire on the first substrate in the second region.

In one embodiment, a width of the widest one of the source-column wires is between 7 μm and 10 μm.

In one embodiment, the wires include gate scan wires.

In one embodiment, the wires include source-column wires and gate scan wires.

In one embodiment, the spacing between the first substrate and the second substrate in the first region is greater than the spacing between the first substrate and the second substrate in the second region, a width of the source-column wire on the first substrate in the first region is greater than a width of the source-column wire on the first substrate in the second region.

In one embodiment, a width of the widest one of the source-column wires is between 7 μm and 10 μm.

The above curved display screen and the manufacturing method thereof have beneficial effects that: any two regions are respectively defined as a first region and a second region, if a spacing between the first substrate and the second substrate in the first region is greater than a spacing between the first substrate and the second substrate in the second region, a capacitor (formed by the wire and the transparent electrode layer on the second substrate) corresponding to the first region is smaller than a capacitor corresponding to the second region in the related art; contradistinctively, in the above curved display screen and the manufacturing method thereof and the first substrate provided by the disclosure, for any two regions, as long as the first region and the second region meet the above condition, on the first substrate, an area of the wire in the first region is set to be larger than an area of the wire in the second region, which is equivalent to increase the capacitor corresponding to the first region and reduce the capacitor corresponding to the second region on the basis of the conventional curved display screen, so that the capacitors corresponding to the first region and the second region tend to the same, and therefore the above curved display screen and manufacturing method reduce the capacitance difference among different regions of the curved display screen, and the display effect is improved consequently.

BRIEF DESCRIPTION OF THE DRAWINGS

In order to more clearly illustrate technical solutions of embodiments of the disclosure or related art, drawings to be used in the description of the embodiments or related art will be briefly described. Apparently, the drawings in the description below are merely some embodiments of the disclosure, a person skilled in the art can obtain other drawings according to these drawings without creative efforts.

DETAILED DESCRIPTION OF EMBODIMENTS

In order to facilitate understanding of the disclosure, the disclosure will be described more fully hereinafter with reference to the accompanying drawings. Preferred embodiments of the disclosure are given in the accompanying drawings. However, the disclosure may be embodied in many different forms and is not limited to the embodiments described herein. Rather, the purpose of providing these embodiments is to make the understanding of the described content of the disclosure be more thorough and comprehensive.

Unless otherwise defined, all technical and scientific terms used herein have the same meaning as commonly understood by one skilled in the art to which the disclosure pertains. The terminologies used herein in the specification of the disclosure are for the purpose of describing particular embodiments only and are not intended to be limiting of the disclosure. The term "and/or" as used herein includes any and all combinations of one or more of related listed items.

Figure 1:
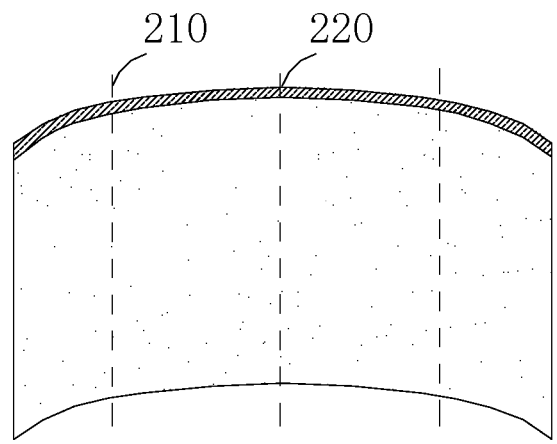
FIG. 1 is a schematic perspective view of a curved liquid crystal display screen provided by an embodiment.
Figure 2:
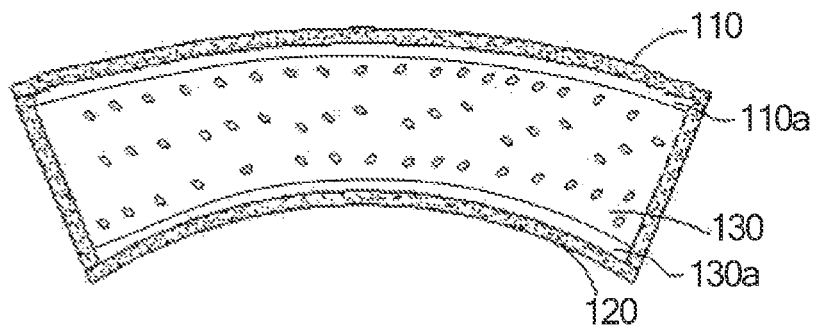
FIG. 2 is a schematic cross-sectional view of the curved liquid crystal display screen of the embodiment shown in FIG. 1.

In an embodiment, a curved display screen is provided and a curved liquid crystal display screen is taken as an example. Referring to FIG. 1 and FIG. 2, the curved liquid crystal display screen includes a first substrate 110, a second substrate 120 and a liquid crystal layer 130 disposed between the first substrate 110 and the second substrate 120. It should be understood that, in other type of curved display screen, the first substrate 110 and the second substrate 120 may have other substance instead disposed therebetween. The first substrate 110 includes an active switch array 110a, and the second substrate 120 includes a transparent electrode layer 130a. The active switch array 110a includes several wires, and the wires are used for transmitting electrical signals. The active switch array 110a is for example a TFT array, and the transparent electrode layer 130a is for example an ITO (indium tin oxide) layer.

Specifically, in the curved liquid crystal display screen, the first substrate 110 may be a rear panel module and includes, in addition to the active switch array 110a, a rear polarizer, a rear glass plate, multiple pixel electrodes, a rear alignment film and so on; and gate electrodes of TFT transistors connect with gate scan wires, and source electrodes of the TFT transistors connect with source-column wires. The second substrate 120 may be a front panel module and includes, in addition to the transparent electrode layer 130a, a color filter, a front glass plate, a front polarizer and so on, and the transparent electrode layer 130a is a common electrode.

In an embodiment of the disclosure, any two regions are respectively defined as a first region and a second region. If a spacing between the first substrate 110 and the second substrate 120 in the first region is greater than a spacing between the first substrate 110 and the second substrate 120 in the second region, an area of a wire on the first substrate 110 in the first region is greater than an area of a wire on the first substrate 110 in the second region.

The wires may be source-column wires or gate scan wires. The spacing between the first substrate 110 and the second substrate 120 is cell gap. The first region and the second region are only relative concepts, in other words, in any two regions of the curved display screen, as long as two regions have different spacings, one of the two regions corresponding to the relatively larger spacing is the first region while the other one corresponding to the relatively smaller spacing is the second region.

With regard to the curved display screen, after being bent, spacings between the first substrate 110 and the second substrate 120 will be different in different regions. Referring to FIG. 2, a middle region usually is corresponding to a smallest spacing, and the closer to left or right edge, the greater a corresponding spacing is. Herein, the middle region is a region where the most middle source-column wire is located, and a judgment baseline for the left and the right is the most middle source-column wire. Therefore, for any two regions, the distance between the first region and the most middle source-column wire is greater than the distance between the second region and the most middle source-column wire. In other words, the second region is closer to the most middle source-column wire than the first region. Exemplarily, FIG. 1 shows two regions including a left region 210 and a middle region 220, the left region is closer to the left edge, the middle region 220 is corresponding to the region where the most middle source-column wire is located, a spacing between the first substrate 110 and the second substrate 120 in the left region 210 is greater than a spacing between the first substrate 110 and the second substrate 120 in the middle region 220, and therefore the left region 210 corresponds to the first region, and the middle region 220 corresponds to the second region.

In addition, when spacings in different regions are different, capacitors (hereinafter capacitors constituted by the wires on the first substrate 110 and the transparent electrode layer of the second substrate 120 are referred to as capacitors) constituted by wires on the first substrate 110 and corresponding different regions on the transparent electrode layer of the second substrate 120 are different, based on a calculation formula of capacitance that $C=\varepsilon S/4\pi kd$, the larger the spacing, the smaller the corresponding capacitance is. It clearly can be found that the capacitor corresponding to the first region is smaller than the capacitor corresponding to the second region. Moreover, since the spacing corresponding to the middle region is the smallest, and the closer to the left or right edge, the larger the corresponding spacing is, and therefore the capacitances tend to decrease gradually from the middle region to the left and right sides.

In an embodiment of the disclosure, in order to overcome the capacitance difference in the above curved display screen, the following solution is taken as that: for any regions, if the spacing between the first substrate 110 and the second substrate 120 in the first region is greater than the spacing between the first substrate 110 and the second substrate 120 in the second region, the area of the wire on the first substrate 110 in the first region is set to be larger than the area of the wire on the first substrate 110 in the second region. Based on the above calculation formula of capacitance, it can be found that, the larger the S (i.e., aligned area of capacitor plates), the larger the capacitance is. Therefore, on the first substrate 110, the area of the wire in the first region is set to be larger than the area of the wire in the second region, which means that the S of the capacitor corresponding to the first region is larger than the S of the capacitor corresponding to the second region. As a result, the embodiment of the disclosure, on the basis of the capacitance corresponding to the first region smaller than the capacitance corresponding to the second region caused by the spacing difference in the conventional curved display screen, can make the capacitances in the two regions tend to be the same by setting suitable areas of wires, i.e., setting the area of the wire in the first region to be larger than the area of the wire in the second region.

In addition, since the first region and the second region only are relative concepts, for the whole curved display screen, as long as regions with different capacitances are caused by spacing difference, by correspondingly adjusting areas of wires, i.e., the area of the wire corresponding to the region with relatively smaller spacing is small while the area of the wire corresponding to the region with relatively greater spacing is large, capacitances in different regions would tend to be the same. More specifically, since in the conventional curved display screen, the closer to the left or right edge, the greater the corresponding spacing is, and therefore the closer to the left or right edge, the larger the area of the wire in the corresponding area is, so that capacitances in respective regions tend to the same.

In summary, the above described curved display screen according to embodiments of the disclosure, by setting suitable areas of wires, it can improve the drawback of capacitance inconsistency in the conventional curved display screen, reduce the capacitance differences among different regions and thereby improve the display effect.

Figure 3:
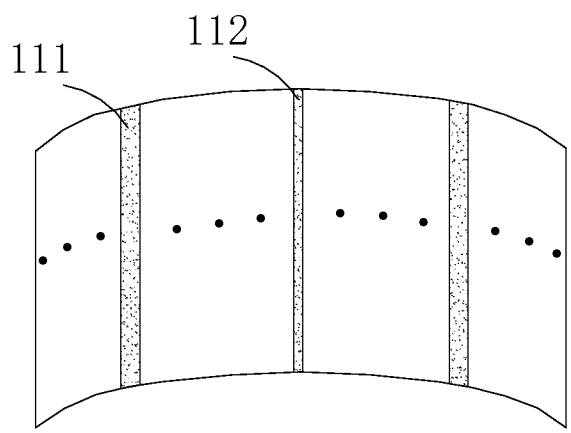
FIG. 3 is a schematic distribution view of source-column wires in the curved liquid crystal display screen of the embodiment shown in FIG. 1.

In an embodiment, the wires include source-column wires. The source-column wires are data lines, and also are various wires in an active matrix formed by multiple TFT transistors and parallel to the Y-axis direction. Therefore, the closer to the left or right edge, the larger the area of the source-column wire in the curved display screen is. Exemplarily, as shown in FIG. 3, the first source-column wire 111 and the second source-column wire 112 respectively are located in the left region 210 and the middle region 220. The area of the first source-column wire 111 is larger than the area of the second source-column wire 112.

It should be understood that, the wires are not limited to the case of source-column wires, for example, if the curved display screen is bent along the lengthwise direction of the source-column wires (i.e., the source-column wires are bent), the wires may include gate scan wires instead.

In an embodiment, if the spacing between the first substrate 110 and the second substrate 120 in the first region is greater than the spacing between the first substrate 110 and the second substrate 120 in the second region, a width of a source-column wire on the first substrate 110 in the first region is set to be greater than a width of a source-column wire on the first substrate 110 in the second region. Therefore, the closer to the left or right edge of the curved display screen, the greater the width of the source-column wire is. Exemplarily, as shown in FIG. 3, the width of the first source-column wire 111 is greater than the width of the second source-column wire 112.

Accordingly, the embodiment of the disclosure adjusts the widths of the source-column wires in different regions to compensate the drawback of capacitance inconsistency in the different regions of the conventional curved display screen, the customer experience is improved consequently.

In an embodiment, a width of the widest one of the source-column wires is between 7 μm and 10 μm. Therefore, widths of the leftmost and rightmost source-column wires of the curved display screen are between 7 μm and 10 μm. In addition, resulting from the level of manufacturing process, a variation range of the source-column wire in width is between 0.7 μm and 1 μm.

In another embodiment, a manufacturing method of a curved display screen is provided. The curved display screen includes the first substrate 110 and the second substrate 120 as shown in FIG. 2. The first substrate 110 includes an active switch array 110*a*, and the active switch array 110*a* includes several wires such as the source-column wires 111, 112 as shown in FIG. 3 even gate scan wires intersecting with the source-column wires 111, 112. The second substrate 120 includes a transparent electrode layer 130*a*.

The manufacturing method of the curved display screen includes: a step of forming wires in a process of preparing the first substrate 110. Moreover, any two regions respectively are defined as a first region and a second region, if a spacing between the first substrate 110 and the second substrate 120 in the first region is greater than a spacing between the first substrate 110 and the second substrate 120 in the second region, in the step of forming wires, on the first substrate 110, an area of the wire in the first region is greater than an area of the wire in the second region.

In an embodiment, the wires include source-column wires e.g., 111, 112 as shown in FIG. 3.

In an embodiment, if the spacing between the first substrate and the second substrate in the first region is greater than the spacing between the first substrate and the second substrate in the second region, a width of a source-column wire on the first substrate in the first region is larger than a width of a source-column wire on the first substrate in the second region.

In an embodiment, a width of the widest one of the source-column wires is between 7 μm and 10 μm.

In an embodiment, the wires include gate scan wires.

In the manufacturing method of a curved display screen according to the embodiment of the disclosure, by setting suitable areas of wires, it can improve the drawback of capacitance inconsistency in the conventional curved display screen, reduce the capacitance differences among different regions and thereby improve the display effect.

It is noted that, the first substrate in the manufacturing method of a curved display screen according to the embodiment of the disclosure corresponds to the first substrate in the curved display screen provided by the above embodiments, and thus will not be repeated herein.

In the several embodiments provided by the disclosure, it should be understood that the described systems, devices and/or methods can be realized in other ways. For example, the embodiments of devices described above are merely illustrative. For example, division of units is only a logical functional division, and other division manner may be adopted in actual implementation, for example multiple units or components can be combined together or integrated into another system, or some features can be omitted or not implemented. In addition, the coupling or direct coupling or communication connection shown or discussed may be indirect coupling or communication connection through some interfaces, devices or units, which may be electrical, mechanical or otherwise.

The units described as separation parts may or may not be physically separated, and the parts shown as units may or may not be physical units, i.e., may be located in one place or distributed over multiple network units. Some or all of the units can be selected according to actual needs to achieve the purpose of the embodiments of the disclosure.

Finally, it should be noted that the above embodiments are merely illustrative of technical solutions of the disclosure and are not intended to be limiting thereof. Although the disclosure is described in detail with reference to the foregoing embodiments, a person skilled in the art should be understood that the technical solutions described in the foregoing embodiments can be modified or some of technical features can be equivalently replaced, and these modifications or replacements do not depart from the spirit and scope of the technical solutions of various embodiments of the disclosure.

What is claimed is:

1. A curved display screen comprising:
   a first substrate, comprising an active switch array, wherein the active switch array comprises a plurality of wires;
   a second substrate, comprising a transparent electrode layer;
   wherein two regions of the curved display screen respectively are defined as a first region and a second region, a spacing between the first substrate and the second substrate in the first region is greater than a spacing between the first substrate and the second substrate in the second region, and on the first substrate, an area of the wire in the first region is larger than an area of the wire in the second region;
   wherein the plurality of wires comprise source-column wires and gate scan wires, and a width of the source-column wire on the first substrate in the first region along an arrangement direction of the source-column wires is greater than a width of the source-column wire on the first substrate in the second region along the arrangement direction;
   wherein the widths of the source-column wires on the first substrate in the first region and in the second region are distances perpendicular to a lengthwise direction of each of the source-column wires.

2. The curved display screen as claimed in claim 1, wherein a width of a widest one of the source-column wires is between 7 μm and 10 μm.

3. The curved display screen as claimed in claim 1, wherein the transparent electrode layer is a common electrode.

4. A curved display screen comprising:
   a first substrate, comprising an active switch array, wherein the active switch array comprises a plurality of wires;
   a second substrate, comprising a transparent electrode layer;
   wherein two regions of the curved display screen respectively are defined as a first region and a second region, a spacing between the first substrate and the second substrate in the first region is greater than a spacing between the first substrate and the second substrate in the second region, and on the first substrate, an area of the wire in the first region is larger than an area of the wire in the second region;
   wherein the plurality of wires comprise source-column wires and gate scan wires, and a width of the source-column wire on the first substrate in the first region along an arrangement direction of the source-column wires is greater than a width of the source-column wire on the first substrate in the second region along the arrangement direction;
   wherein the widths of the source-column wires on the first substrate in the first region and in the second region are distances perpendicular to a lengthwise direction of the source-column wires;
   wherein a width of a widest one of the source-column wires is between 7 μm and 10 μm.

5. The curved display screen as claimed in claim 4, wherein the plurality of wires comprise gate scan wires.

6. The curved display screen as claimed in claim 4, wherein the transparent electrode layer is a common electrode.

7. The curved display screen as claimed in claim 4, wherein the plurality of wires comprise source-column wires, and the transparent electrode layer is a common electrode.

8. The curved display screen as claimed in claim 4, wherein the plurality of wires comprise gate scan wires, and the transparent electrode layer is a common electrode.

* * * * *